| United States Patent [19] | [11] 4,134,080 |
|---|---|
| Gentzler | [45] Jan. 9, 1979 |

[54] LOW INDUCTANCE RESISTOR

[75] Inventor: Charles R. Gentzler, South Pasadena, Calif.

[73] Assignee: Cutler-Hammer, Inc., Milwaukee, Wis.

[21] Appl. No.: 846,113

[22] Filed: Oct. 27, 1977

[51] Int. Cl.² ............................................. H03F 3/14
[52] U.S. Cl. .............................. 330/307; 338/22 SD; 357/51
[58] Field of Search ................... 330/307; 338/22 SD; 357/51

[56] References Cited

U.S. PATENT DOCUMENTS

| 2,978,661 | 4/1961 | Miller et al. ................ 338/22 SD X |
| 3,271,685 | 9/1966 | Husher et al. ................ 330/307 X |
| 3,359,504 | 12/1967 | Bento et al. ................ 330/307 X |

Primary Examiner—Lawrence J. Dahl
Attorney, Agent, or Firm—Kevin Redmond

[57] ABSTRACT

A low inductance resistor comprising a metalized, planar silicon wafer, positioned beneath the emitter tabs of an RF power transistor to provide dc balancing and stabilization and thus eliminate the need for more costly collector feedback circuits.

2 Claims, 12 Drawing Figures

LOW INDUCTANCE RESISTOR

BACKGROUND

1. Field

The present invention pertains to low inductance resistors, and in particular, to resistors designed for use in the emitter circuits of Class A RF power transistors.

2. Prior Art

A primary concern in the design of Class A RF power transistor circuitry is thermal runaway. During thermal runaway, the transistor current continuously increases until the transistor thermal dissipation limit has been exceeded. Some form of dc stabilization circuitry is usually necessary to prevent thermal runaway and maintain the transistors at a suitable, stable operating point, despite changes in the dissipation and ambient temperature.

Stabilization circuitry for RF power transistors commonly includes either collector or emitter feedback. A circuit employing collector feedback is shown in FIG. 3. This circuit comprises a trnsistor 1, a resistor 7, and a feedback network 8. In the operation of the circuit of FIG. 3, an increase in collector current is sensed across the resistor 7 by the feedback network 8. The feedback network adjusts the transistor bias supply accordingly to reduce, and thereby stabilize, the transistor collector current. The feedback circuit usually includes one or more transistors to amplify the voltage sensed across the resistor 7 and provide a means of accommodating the difference in voltage between the collector and base circuits.

Although the collector feedback circuit does stabilize the collector current, there are several disadvantages inherent in its operation. For example, the additional transistors in the feedback circuit increase the size and cost of the overall amplifier. The feedback network includes a delay which may result in the failure of the RF power transistor because the feedback reaction is not quick enough to protect the RF transistor. The feedback network reduces collector current caused by high signal levels and results in undesired signal compression. Finally, the feedback circuit reduces reliability because it includes a substantial number of additional active components. The reliability problem is further complicated because the failure of a relatively low cost component, such as a transistor in the feedback circuit, can result in the failure of the more costly RF power transistor it was intended to protect.

Emitter feedback circuits overcome most of the disadvantages of collector feedback circuits, however, the emitter feedback circuits present a number of different problems. A circuit employing emitter feedback is shown in FIG. 1. This circuit comprises a transistor 1, an emitter feedback resistor 3, and an emitter bypass capacitance 4. In the operation of this circuit, an increase in emitter current increases the voltage across the emitter resistor 3. This voltage tends to reduce the forward bias across the emitter-base of the transistor and thereby operates to stabilize the transistor current.

Unless an emitter resistor is bypassed for RF current, it reduces the RF gain of the RF power transistor. Where a relatively high value of emitter resistance is employed, a low impedance capacitor placed in shunt effectively bypasses the emitter resistor, leaving the RF gain of the transistor relatively unaffected. However, where a low value emitter resistance is employed, for example one ohm, it is difficult to provide a bypass capacitor which has a sufficiently low impedance to be effective as a bypassing element. In addition, the impedance of the emitter resistor and any bypass capacitor may well exceed one ohm at RF frequencies, despite their nominal value, because of lead inductance or device inductance caused by physical size. High power application may require the bypass capacitor to carry current as high as ten amperes. A low value of equivalent series resistance in the capacitor can produce a significant voltage drop. Finally, the bypass circuit can have parasitic elements which cause it to parallel resonate and destroy the gain of the amplifier at a frequency in the passband.

FIG. 2 shows a conventional emitter resistor and bypass capacitor drawn approximately to scale. It can be seen that there is appreciable lead length associated with both the resistor and the capacitor. The lead length inductance and losses associated with the capacitor usually make bypassing for low values of resistance impractical.

Where a low value of emitter resistor is chosen, the resistor is generally employed without bypassing, and an effort is made to reduce lead length inductance and other inductances associated with the resistor. One method of reducing the resistor inductance is to parallel a number of resistors. Unfortunately, this approach produces a bulky assembly and the reduction in inductance obtained is usually far from optimum. A number of modern power transistors employ internal emitter resistors to balance each of the individual transistor elements that make up the overall transistor; however, these resistances are insufficient for Class A biasing and external resistance is generally required.

Thin film resistors of the type shown in FIG. 4 have a lower inductance than conventional resistors. The resistor of FIG. 4 comprises a resistive element 9, an input contact 10, and an output contact 11. Current flows from the input contact through the resistance element to the output contact in a longitudinal direction, as shown by the arrow 12. The relatively short lead length tends to reduce the inductance of this type resistor over conventional carbon resistors, but the inductance is still appreciable because of the length of the body of the thin film resistor and its relatively narrow cross sectional area.

SUMMARY

According to this invention, planar silicon wafers metalized on their planar surfaces and configured to conform to the general outline of the emitter tabs of power transistors are applied as external dc stabilization resistors. The current flows through these resistors in a direction perpendicular to their planar surfaces. These resistors have no lead length, their cross sectional area is large, and their path length is short. These features combine to provide a resistor that is conveniently installed in RF power applications and exhibits an inductance lower than any prior art design, suitable for these applications.

DETAILED DESCRIPTION OF THE INVENTION

Figure 1:
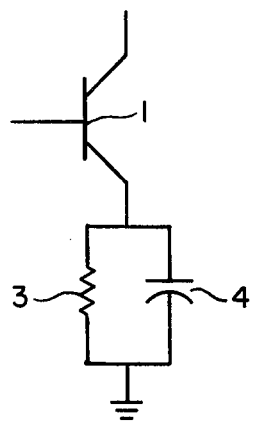
FIG. 1 is a schematic of a transistor circuit employing an emitter stabilization resistor and an emitter bypass capacitor.
Figure 3:
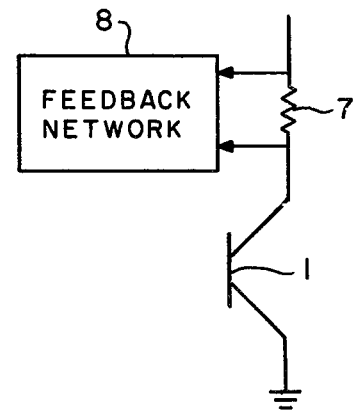
FIG. 3 is a schematic diagram of a prior art transistor circuit which includes a collector feedback network.
Figure 2:
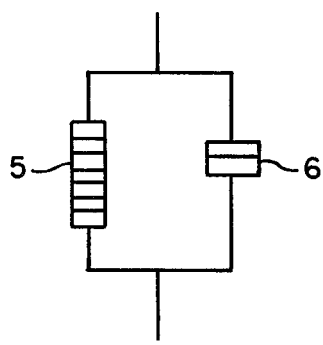
FIG. 2 is a pictorial view of a conventional resistor and bypass capacitor, drawn approximately to scale.
Figure 4:
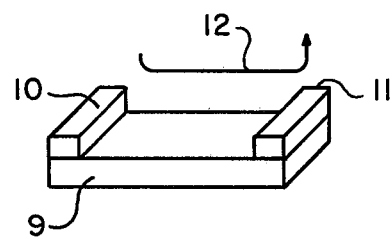
FIG. 4 is a pictorial drawing of a thin film resistor.
Figure 5:
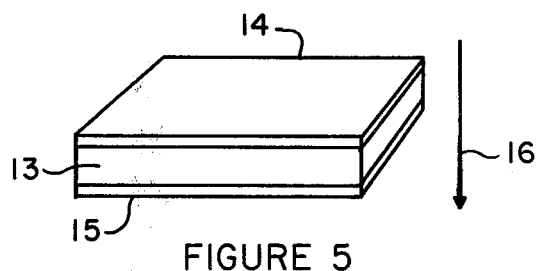
FIG. 5 is a pictorial drawing of a resistor configured in accordance with the present invention.

The basic embodiment of the present invention as shown in FIG. 5, comprises a silicon layer 13, an upper metalized layer 14, and a lower metalized layer 15. The direction of current flow through this resistor is perpendicular to the planar surface as indicated by the arrow 16. The silicon layer has a thickness typically ranging between 0.015 and 0.075 inches and a resistivity about 4 ohms-centimeter. The upper and lower metalized layers are contacts that are typically formed by an evaporated layer of aluminum which is then covered with a layer of gold. The resistance of the device between the upper and lower metalized layers is typically one ohm or less. The thermal coefficient of resistance is generally + 0.0035 ohms per ohm per degree centigrade.

Figure 6:
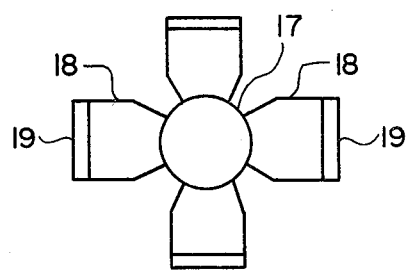
FIG. 6 is a top view of a resistor configured in accordance with the present invention, and positioned beneath the emitter tabs of an RF stud package transistor.
Figure 7:
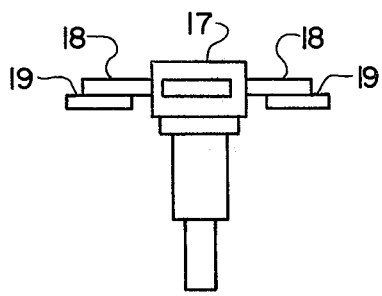
FIG. 7 is a side view of a resistor configured in accordance with the present invention, and positioned beneath the emitter tabs of an RF stud package transistor.

FIGS. 6 and 7 shows the device of FIG. 5 as used with a stud package transistor. The resistive wafers are placed under the emitter tabs of the transistor. In these Figures the transistor is designated by drawing numeral 17, the emitter tabs by numeral 18 and the resistive wafers by numeral 19.

Figure 8:
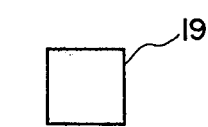
FIG. 8 is a top view of the resistor employed in FIGS. 6 and 7.

In FIG. 8, it can be seen that the resistors 19 are cut rectangularly to accommodate the emitter tabs of the transistor 17.

Figure 9:
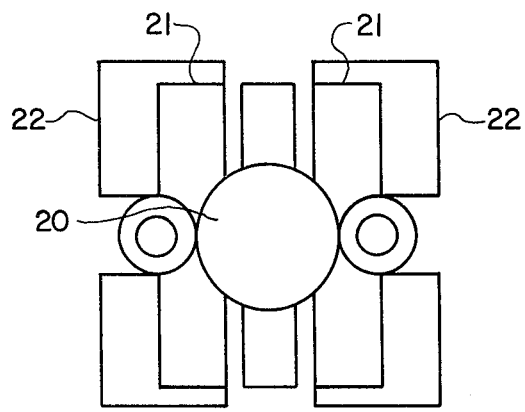
FIG. 9 is a top view of a resistor configured in accordance with the present invention and positioned beneath the emitter tabs of a flange package RF transistor.
Figure 10:
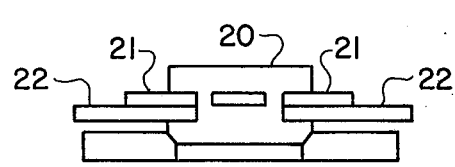
FIG. 10 is a side view of a resistor configured in accordance with the present invention and positioned beneath the emitter tabs of an RF flange package transistor.
Figure 11:
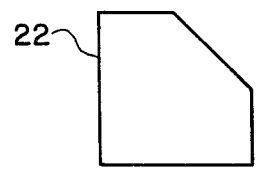
FIG. 11 is a top view of the resistor shown in FIGS. 9 and 10.

FIGS. 9 and 10 show a variation of the present invention configured to operate with a flange type high power transistor. The emitter tabs 21 of the transistor 20 rest on the resistive wafers 22. In FIG. 11, it can be seen that the resistors are generally rectangular with the exception that a corner is removed to provide clearance for the transistor body when the resistive wafers are positioned under the emitter tabs of this type of transistor.

Figure 12:
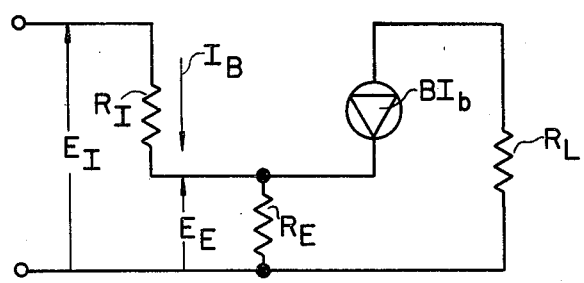
FIG. 12 is a schematic diagram of a transistor equivalent circuit.

The function of an emitter resistor in stabilizing the collector current may be understood with the aid of the transistor hybrid equivalent circuit shown in FIG. 12. This circuit comprises an input resistance $R_I$, an external emitter resistance $R_E$, an equivalent collector current generator $BI_B$ and a load resistance $R_L$. The drive to this circuit is an input voltage, symbolized by $E_I$, which generates a base current $I_B$. The voltage across the emitter resistor is symbolized by $E_E$. The base current in this circuit is given by the equation 1 through 4:

$$I_B = \frac{E_I - E_E}{R_I} \quad [1]$$

$$I_B = \frac{E_I - (1 + B) I_B R_E}{R_I} \quad [2]$$

$$I_B \left[ \frac{R_I + (1 + B) R_E}{R_I} \right] = \frac{E_I}{R_I} \quad [3]$$

$$I_B = \frac{E_I}{R_I + (1 + B)R_E} \quad [4]$$

$$\frac{E_I}{I_B} = R_I + (1 + B)R_E \quad [5]$$

$$BI_B = \frac{BE_I}{R_I + (1 + B)R_E} \quad [6]$$

It can be seen from equation 4 that the base current $I_B$ and thus the collector current $BI_B$ are functions of the factor $(1+B)R_E$. As this factor approaches the magnitude of $R_I$ or exceeds it, the base current becomes more dependent upon the size of the emitter resistor $R_E$ than on the internal input resistance of the transistor $R_I$.

From equation 5 it can be seen that the effective input resistance, defined as the input voltage $E_I$ divided by the base current $I_B$, is equal to $R_I$ plus the factor $(1+B)R_E$. Therefore, the input impedance of the transistor may be more dependent on the factor $(1+B)R_E$ than on $R_I$. From these relationships it can be seen that an emitter resistor is a simple and effective device which can be used to stabilize the current of a transistor. It can also be used to adjust and thus balance the collector current of two different transistors in a push-pull circuit despite some differences in their parameters.

The RF parameters of the transistor are also affected by an unbypassed emitter resistor. The circuit of FIG. 12 is similar to that of a high frequency equivalent circuit, except for the omission of internal capacitances. However, the circuit as shown is sufficient to illustrate some basic RF relationships. It can be seen from equation [6] that the collector current $BI_B$, which is directly related to the transistor gain, is reduced by the factor $(1+B)R_E$ in a circuit employing an unbypassed emitter resistor. From the standpoint of gain alone, it would seem to be desirable to eliminate the $(1+B)R_E$ factor by bypassing; however, as noted above, it is impractical to bypass low values of emitter resistance and the practical approach is to avoid as much loss as possible by providing an emitter resistor with the lowest possible inductance.

The planar structure and the direction of current flow in the present invention, as illustrated in FIG. 5, provide very low inductance. There is virtually no lead length, and the path length through the resistance is short. The planar shape of the present invention makes it convenient for installation under transistors as illustrated in FIGS. 6 through 11. Currently popular transistor configurations generally have emitter tabs extending from the sides of the transistors, as shown in these figures. The present invention may be placed directly beneath these emitter tabs in standard mounting configurations. Connections are made to the emitter tabs by soldering directly to the top metalized layer of the resistors. The resistors themselves are connected to the circuit by soldering their lower sides to a printed circuit board or a ground plane. No modification of the transistor is necessary for installation.

The positive temperature coefficient of the silicon material used in these resistors causes the value of resistance to increase with increasing temperatures. As the transistor dissipation increases, the silicon resistor is heated and increases in value to oppose the usual increase in collector current caused by increased operating temperatures.

There is virtually no delay in the collector current stabilizing action of an emitter resistor. As soon as the collector current increases for any reason, the emitter resistor immediately produces a voltage which operates to reduce the collector current.

Silicon resistors of this type are easy to produce as silicon technology has been well developed over the past 20 years and there are many facilities capable of producing these devices. A wide selection of silicon with varying resistivities and configurations are available.

Modern dicing equipment makes it a relatively simple matter to cut these resistors to the required shape necessary to accommodate currently available power transistors, especially those with emitter tabs. These types of transistors are usually designed for operation in the VHF and UHF range.

The lower inductance of these resistance provides significant advantages in amplifier size and cost. For example, conventional emitter resistors were replaced by the wafer type resistors of the present invention in an RF amplifier providing an output of 10 watts. Without any other significant change, the amplifier gain and output power were doubled. To achieve the same performance with a conventional emitter resistor, an additional amplification stage was required at a significantly higher cost.

I claim:

1. A transistor power amplifier stage employing a transistor with an external tab type emitter lead characterized in that said stage includes an external emitter stabilization resistor formed of a planar silicon wafer not exceeding 0.1 inches in thickness and containing metalization on both planar surfaces, said wafer being cut to approximately the size of the emitter tab with one planar surface of said resistor being aligned with and connected to said emitter tab to cause the emitter current from the tab to flow through the emitter resistor generally perpendicular to the planar surface of the resistor to the electrical circuit of the amplifier stage.

2. A transistor power amplifier stage as claimed in claim 1, wherein said planar resistor is connected to the underside of the emitter tab and the planar side of said resistor opposite the side connected to the transistor tab is connected to the electrical circuit of the amplifier stage.

* * * * *